(12) United States Patent
Khalil et al.

(10) Patent No.: US 7,050,781 B2
(45) Date of Patent: May 23, 2006

(54) SELF-CALIBRATING TUNABLE FILTER

(75) Inventors: Waleed Khalil, Tempe, AZ (US); Tsung-Yuan Chang, Chandler, AZ (US); Bobby Nikjou, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 10/146,740

(22) Filed: May 16, 2002

(65) Prior Publication Data

US 2003/0216129 A1    Nov. 20, 2003

(51) Int. Cl.
*H04B 1/10* (2006.01)
(52) U.S. Cl. .................. 455/340; 455/307; 327/553
(58) Field of Classification Search ............... 455/318, 455/340, 266, 197.2, 307; 327/553, 552, 327/554; 330/305; 333/172, 167
See application file for complete search history.

(56) References Cited

U.S. PATENT DOCUMENTS

| | | | | |
|---|---|---|---|---|
| 3,760,287 | A * | 9/1973 | Harris ........................ | 330/9 |
| 5,914,633 | A * | 6/1999 | Comino et al. ............ | 327/553 |
| 5,995,817 | A * | 11/1999 | Lubbe et al. ............... | 455/266 |
| 6,181,218 | B1 * | 1/2001 | Clark et al. ............. | 331/177 R |
| 6,618,579 | B1 * | 9/2003 | Smith et al. ................ | 455/307 |
| 6,681,102 | B1 * | 1/2004 | Collier et al. ............... | 455/296 |
| 6,747,522 | B1 * | 6/2004 | Pietruszynski et al. . | 331/177 R |

\* cited by examiner

*Primary Examiner*—Edward F. Urban
*Assistant Examiner*—Blane J. Jackson
(74) *Attorney, Agent, or Firm*—Schwegman, Lundberg, Woessner & Kluth, P.A.

(57) ABSTRACT

Some embodiments of the present invention include a circuit in a wireless transmitter or other apparatus is automatically calibrated using a calibration circuit to accommodate provide a desired characteristic such as a filter response, where the component values of the filter circuit may vary such as in an integrated circuit. In one embodiment, the calibration circuit is coupled to one or more adjustable capacitors in the filter circuit to select a capacitor value so that the filter circuit exhibits the desired filter response. In one particular embodiment, the adjustable capacitor is charged in an RC circuit for each clock cycle at power up. The value of the adjustable capacitor is changed for each clock cycle until the capacitor charges to a level greater than or equal to predetermined reference voltage. When the capacitor is charged to a predetermined reference voltage, a desired capacitance value is indicated, and the adjustable capacitor is maintained at the desired capacitance value to provide the desired filter output. The calibration circuit causes the circuit to be self-calibrating to the desired characteristic such as a desired filter response. Other embodiments are described and claimed.

15 Claims, 4 Drawing Sheets

US 7,050,781 B2

SELF-CALIBRATING TUNABLE FILTER

DESCRIPTION OF THE DRAWING FIGURES

The embodiments of the present invention may be understood by those skilled in the art by reference to the accompanying figures in which.

DETAILED DESCRIPTION

Figure 1:
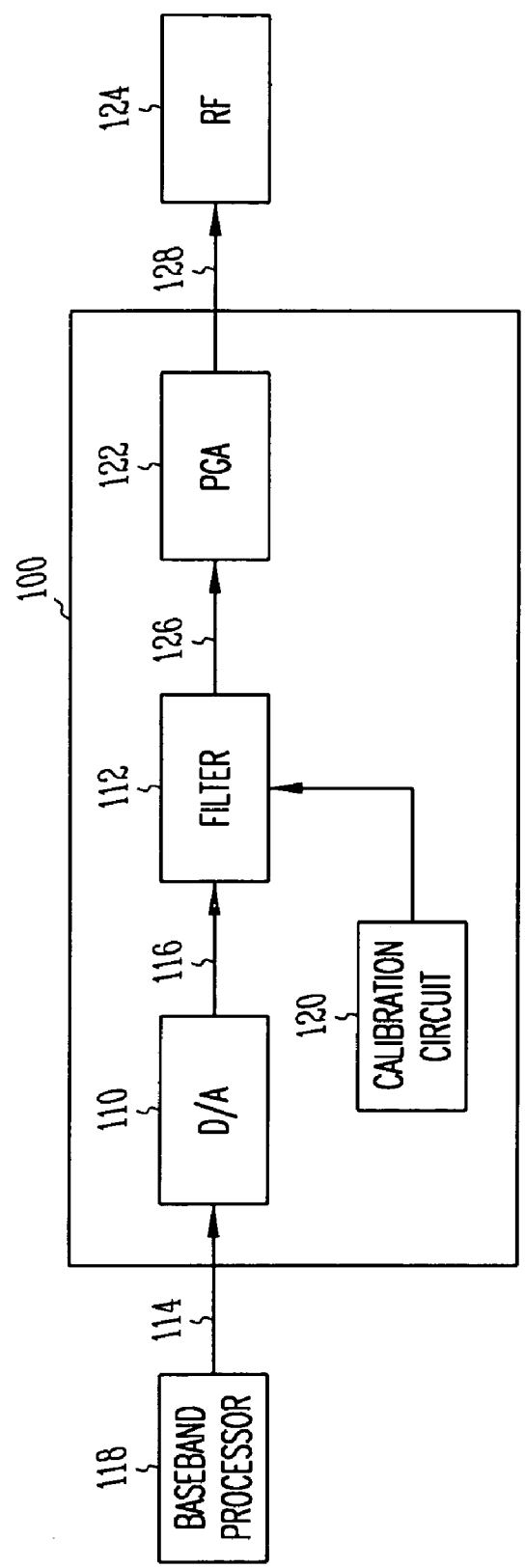
FIG. 1 is a block diagram of a transmitter in which the self-calibrating filter of the embodiments of the present invention is utilized.

Referring now to FIG. 1, a transmitter utilized in a wireless communications system in accordance with one embodiment of the invention is shown. A transmitter 100 as shown in FIG. 1 may be utilized as a modulator in an analog or digital baseband transmitter system. Transmitter 100 includes a digital-to-analog (D/A) converter 110 to convert a digitally modulated signal received from a baseband processor 118 at an input 114 of transmitter into an analog signal 116. Typically, the signal may be oversampled above the baseband signal bandwidth. A filter 112 receives the analog output 116 from D/A converter to reconstruct the output 116 of D/A converter 110 to provide an output signal 126 having a desired frequency characteristic. Accuracy and roll-off characteristics of filter 112 may be selected as desired to meet a frequency mask requirement in order to minimize spurious emissions, adjacent channel leakage, and image frequency spectra. In one embodiment of the invention, filter 112 may be a self-calibrating, active RC filter designed to accommodate one or more of the foregoing criteria. In such an embodiment, a calibration circuit 120 may automatically calibrate and tune the response of filter 112 so that filter 112 may provide a desired output characteristic such as a desired frequency response.

In one embodiment of the invention, transmitter 100 may be disposed on an integrated circuit. In such an integrated circuit, calibration circuit 120 may automatically calibrate filter 112 to accommodate process variation in the integrated circuit, for example die-to-die variation, in which component values of the integrated circuit, for example resistors or capacitors, may vary over a statistical range of values. Calibration circuit 120 may make an adjustment to one or more components of filter 112 to control the output 126 of filter 112. As a result, variation in the output 126 of filter 112 may be controlled by calibration circuit 120 to be closer to a desired output than an uncalibrated circuit exhibits as a result of the process variation.

The output 126 of filter 112 may be provided to a programmable gain amplifier (PGA) to provide a desired signal level. The output 128 of programmable gain amplifier is provided to a radio-frequency module 124 to broadcast the output signal 128 of the transmitter 100 via radio-frequency transmissions.

Figure 2:
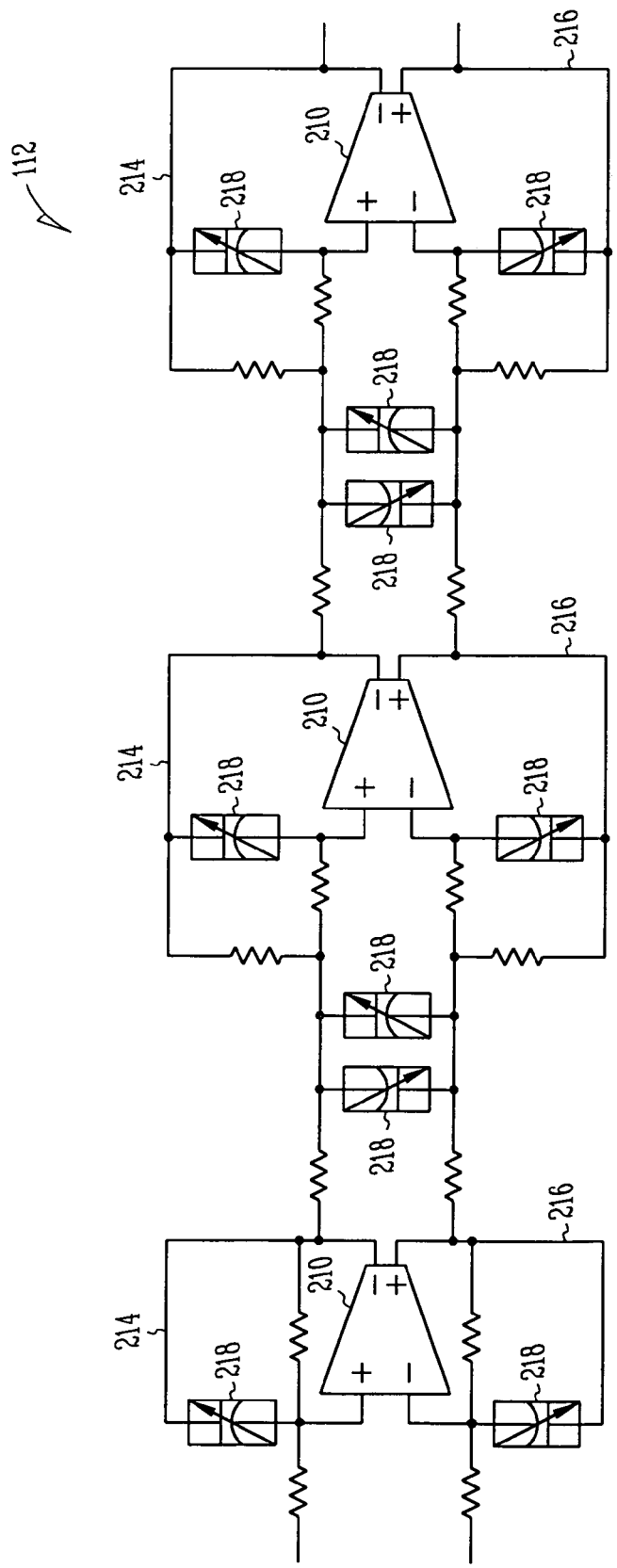
FIG. 2 is a schematic of an embodiment of a self-calibrating filter in accordance with the embodiments of the present invention.

Referring now to FIG. 2, a self-calibrating filter in accordance with the embodiments of the present invention is illustrated. Filter 112 may be constructed in one embodiment as shown using one or more serially cascaded operational amplifiers 210, where each amplifier may have one or more feedback loops 214 and 216. Filter 112 may exhibit a self-calibrating characteristic via an adjustable value capacitor 218 disposed in one or more of feedback loops 214 and 216 of a respective operational amplifier 210. Furthermore, one or more of adjustable value capacitors 218 may be disposed between the non-inverting and inverting terminals of operational amplifiers 210, where one or more of adjustable value capacitors 218 may be disposed between first and second operational amplifiers 210, and one or more of adjustable value capacitors 218 may be disposed between second and third operational amplifiers as shown in FIG. 2. Details of adjustable value capacitors 218 are shown in and described with respect to FIG. 3. Although filter 112 is shown in FIG. 2 as comprising operational amplifiers 210, capacitors 218, and resistors, filter 112 include other combinations of more or less components, or other components such as inductors or SAW elements, without departing from the scope of the embodiments of the invention.

Figure 3:
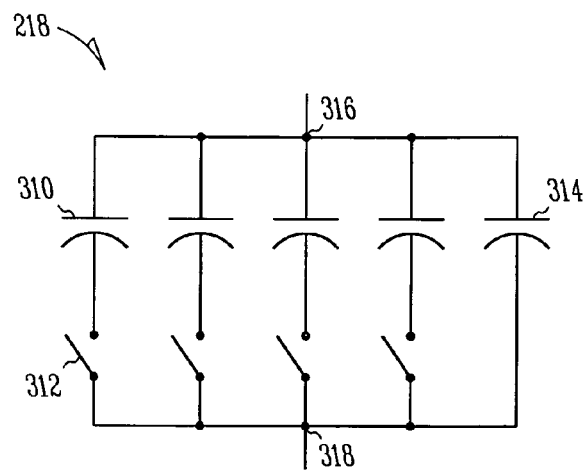
FIG. 3 is a diagram of an adjustable value capacitor array utilized in a self-calibrating filter in accordance with the embodiments of the present invention.

Referring now to FIG. 3, an adjustable value capacitor in accordance with the embodiments of the present invention is illustrated. As shown in FIG. 3, adjustable value capacitor 218 may comprise an array of capacitors 310 connected in parallel between nodes 316 and 318. In one embodiment of the invention as shown, array of capacitors 310 may include four capacitors connected in parallel where the four capacitors are controlled with an array of switches 312, one switch controlling a respective corresponding capacitor. In addition, an additional capacitor 314 may be connected in parallel with the other capacitors in the array of capacitors 310 to provide a capacitance between nodes 316 and 318 when the switches in the array of switches 312 are set as open. By controlling the opening and closing of individual switches in the array of switches 312, the corresponding capacitors 310 may be selectively coupled with or decoupled from capacitor 314 to correspondingly increase or decrease the overall total capacitance between nodes 316 and 318. The switches may be controlled with a binary number input 410, such as a 4-bit word from an output of a counter, to control the capacitance value between nodes 316 and 318 according to a selected combination of capacitors. In such an embodiment, the values of capacitors 310 may be binary weighted over a desired capacitance value range for adjustable value capacitor 218.

Alternatively, a word having any number of bits, e.g., an m-bit word, may be used according to the number of switches in array of switches 312 to arrive at a desired number of combinations of values for adjustable value capacitor 218. For example, array of switches 312 may include eight switches where the switches are controlled with an 8-bit word. In such a configuration, the combinations of capacitor 314 and capacitors in the array 310 may provide a variable capacitance for filter 112. In one embodiment, +/−7% tuning accuracy and +/−40% variation range may be achieved for 4-bits adjustable value capacitor, and other tuning accuracies and variation ranges, greater or lesser, may be alternatively provided. In one embodiment as shown in FIG. 2, the switches in the array of switches 312 of adjustable value capacitor 218 may be arranged to have the switches connected to a virtual ground of operational amplifiers 210 in order to reduce switch parasitic effects on the response of filter 112.

Figure 4:
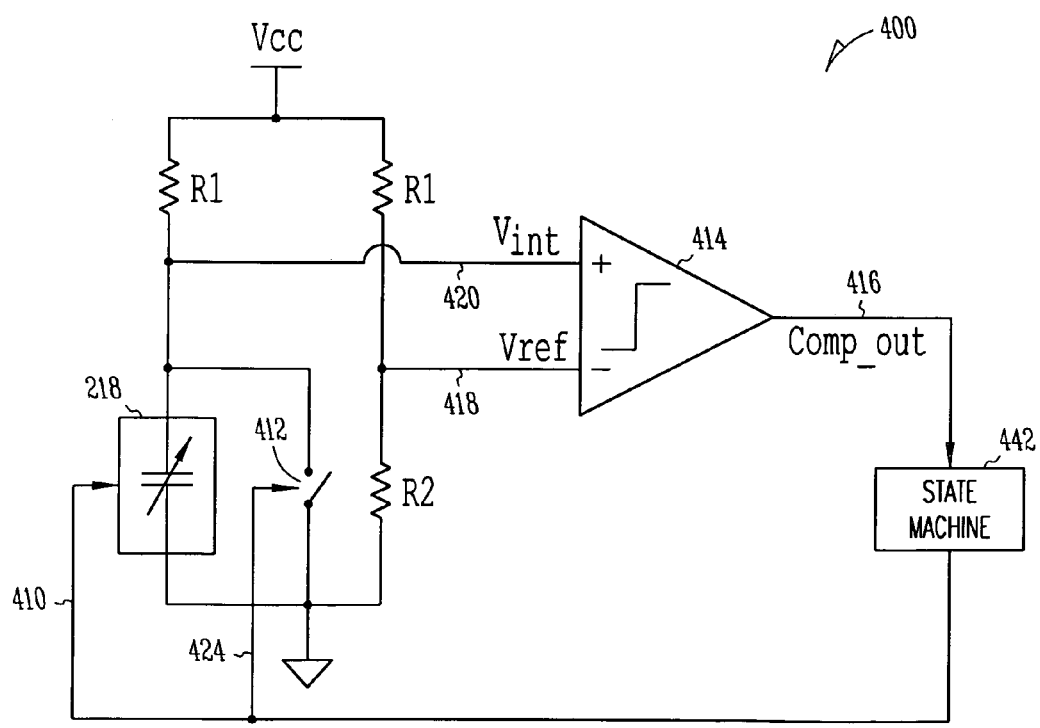
FIG. 4 is a calibration circuit for adjusting an adjustable value capacitor array in accordance with the embodiments of the present invention.

Referring now to FIG. 4, a calibration circuit for calibrating the self-calibrating filter of FIG. 2 is illustrated. In one embodiment of the invention, calibration circuit 400 may be disposed on the same integrated circuit on which filter 112 is also disposed. In the embodiment shown in FIG. 4, the output of a 4-bit counter bus may be provided to adjustable value capacitor 218 to control the operation of the corresponding switches in the array of switches 312 as shown in and described with respect to FIG. 2. The reference voltage (Vref) for comparator 414 may be defined as:

$$Vref = Vcc\left(1 - e^{\frac{-T}{2R1C_{total}}}\right) - \Delta V_{comp}$$

where T is the clock period, $\Delta V_{comp}$ is the offset error of the comparator, and $C_{total}$ is the total combined capacitance of adjustable value capacitor 218 exhibited between nodes 316 and 318. The initial voltage $V_{int}$ on input 420 of comparator 414 may start at a lower value. Then as the tuning code down counting progresses, the overall value of the adjustable value capacitor 218 decreases and $V_{int}$ increases code by code until it exceeds the reference voltage Vref. When the voltage $V_{int}$ exceeds the reference voltage Vref, the output 416 of comparator may transition from a lower value to a higher value, thereby terminating the calibration process. The overall value of adjustable value capacitor 218 may be maintained at the value obtained when the calibration process is terminated. In one embodiment, the calibration process may occur each time transmitter 100 is powered on to thereby ensure that process and temperature variation effects are taken into account. In one particular embodiment, the 4-bits case, a state machine 422 may be utilized to control the power-on calibration process to ensure that the operation may terminate after 16 clock cycles or earlier in the embodiment shown. In alternative embodiments, the calibration process may occur over an alternative range of clock cycles according to the number of bits in the word provided to adjustable value capacitor 218 and corresponding number of switches in array of switches 312 according to the desired combination of values for adjustable value capacitor 218. In one embodiment, state machine 422 includes a counter to provide a changing binary number to adjustable value capacitor 218 to vary the value of adjustable value capacitor 218 for each clock cycle according to the updated value of the binary number. A charge control switch 412 is coupled to adjustable value capacitor 218 to control charging and discharging of adjustable value capacitor 218 according to an RC circuit characteristic exhibited by a combination of R1 and adjustable value capacitor 218. Charge control switch 412 is controlled by state machine 422 via control line 424.

Alternatively, the roles of R1 and adjustable value capacitor 218 may be reversed so that the value of resistor R1 is adjustable according to a binary word input 410. In such an embodiment, capacitors 310 of adjustable value capacitor 218 may be replaced by a fixed value capacitor and by making resistor R1 an adjustable value resistor. In further alterative embodiments, an adjustable value component may be provided with any one of numerous types of electronic components, including but not limited to resistors, capacitors, and inductors in various circuit combinations with other components to calibrate a circuit.

Figure 5:
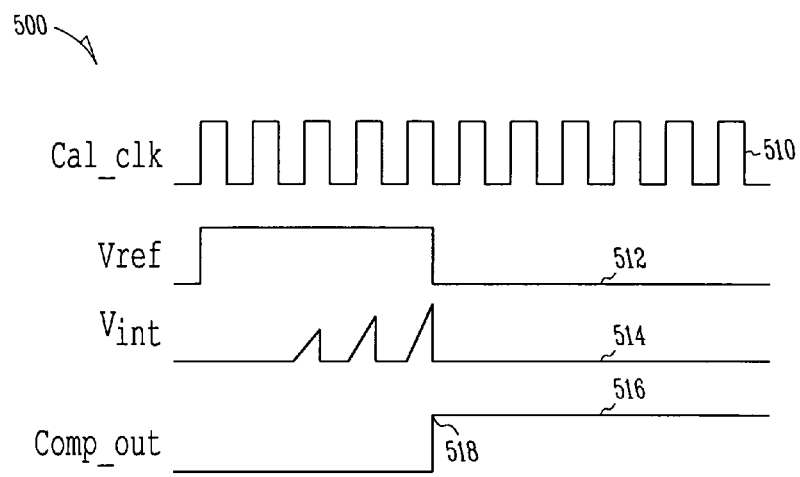
FIG. 5 is a signal timing diagram illustrating the operation of the calibration circuit shown in FIG. 4.

Referring now to FIG. 5, a timing diagram for the operation of the filter of FIG. 2 is shown. As illustrated in timing diagram 500, a calibration clock signal 510 may be provided as a timing reference. The reference voltage Vref may transition from a lower value to a higher value upon startup. As the value of the 4-bit counter changes with each clock cycle, the value of adjustable value capacitor 218 may change in response, and the value of $V_{int}$ may ramp up to a level based on the value of adjustable value capacitor 218 during that clock cycle as shown at signal 514. When the value of $V_{int}$ is less than the reference voltage Vref, the output 416 of comparator 414 remains low. When the value of $V_{int}$ ramps up to a level that meets or exceeds the value of Vref, the output 416 of comparator 414 transitions to a higher value, at which point the calibration process terminates and the value of adjustable value capacitor 218 is maintained, thereby calibrating the output 118 of filter 112. An example frequency response of filter 112 is shown in FIG. 6.

Figure 6:
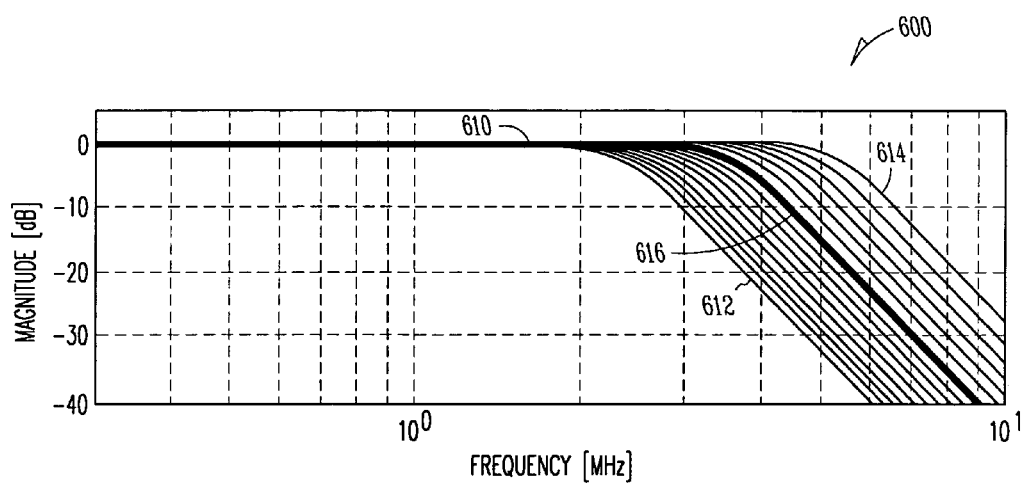
FIG. 6 is a plot illustrating the filter frequency response of a self-calibrating filter in accordance with the embodiments of the present invention.

Referring now to FIG. 6, a plot of the frequency response of the self-calibrating filter in accordance with the embodiments of the present invention is illustrated. In one embodiment of the invention, the filter response of filter 112 across the tuning range of filter 112 is shown for a cutoff frequency target of 3.72 MHz. The frequency response of filter 112 ranges from a lower value 612 and an upper value 614. The calibration cutoff frequency 616 shown in the present embodiment is 3.68 MHz and as such is within 1.1% of the target cutoff frequency of 3.72 MHz.

Although the embodiments of the invention have been described with a certain degree of particularity, it should be recognized that elements thereof may be altered by persons skilled in the art without departing from the spirit and scope of the embodiments of the invention. Such embodiments of the inventive subject matter may be referred to, individually and/or collectively, herein by the term "invention" merely for convenience and without intending to voluntarily limit the scope of this application to any single invention or inventive concept if more than one is in fact disclosed. Thus, although the embodiments of the invention are discussed with respect to a self-calibrating circuit such as a filter that calibrates an output of the circuit using a calibration circuit, the embodiments of the invention need not be limited on one particular application or circuit or embodiment, and need not be limited to wireless transmitters. Furthermore, the embodiments of the invention may be applied to other adjustable value components in lieu of an adjustable capacitor. Another example of an application of the embodiments of the invention is in a self-calibrating serial input/output (I/O) circuit in which an output impedance may be automatically matched to a transmission line impedance. In such an example, the calibration circuit of the embodiments of the invention enable the output impedance of a transmitter to be self calibrating to be nearer to the transmission line impedance than without the calibration circuit by varying the overall value of an adjustable value resistor network in lieu of an adjustable value capacitor network as discussed by example herein, to obtain, for example, closer impedance matching between the serial I/O circuit and the transmission line.

It is believed that the self-calibrating filter of the embodiments of the present invention and many of its attendant advantages will be understood by the forgoing description, and it will be apparent that various changes may be made in the form, construction and arrangement of the components thereof without departing from the scope and spirit of the embodiments of the invention or without sacrificing all of its material advantages, the form herein before described being merely an explanatory embodiment thereof, and further without providing substantial change thereto. It is the intention of the claims to encompass and include such changes.

What is claimed is:

1. An apparatus, comprising:
   a filter comprising a first stage and a second stage, the first stage having a differential output and the second stage having a differential input;
   an adjustable value capacitor coupled in parallel between the differential output of the first stage of the filter and the differential input of the second stage of the filter; and
   a calibration circuit coupled to the adjustable value capacitor, the calibration circuit being driven by a calibration clock signal and including a comparator and a state machine, wherein the state machine is configured to cause a capacitance value of the adjustable value capacitor to decrease from a higher capacitance value to a lower capacitance based on an input value represented by a number of input binary bits, wherein the calibration circuit is configured to terminate a calibration operation after a number of clock cycles, wherein the number of clock cycles is at most equal to two to the power of the number of the input binary bits, and wherein the calibration circuit adjusts a cutoff frequency of the filter when the filter is powered on by adjusting the capacitance value of the adjustable value capacitor until the cutoff frequency of the filter is within a predetermined range of a target cutoff frequency.

2. The apparatus as claimed in claim 1, wherein the calibration circuit adjusts the capacitance value of the adjustable value capacitor until the comparator detects that a voltage across the adjustable value capacitor exceeds a reference voltage.

3. An apparatus, comprising:
   a filter comprising a first stage and a second stage, the first stage having a differential output and the second stage having a differential input;
   an adjustable value capacitor coupled in parallel between the differential output of the first stage of the filter and the differential input of the second stage of the filter; and
   a calibration circuit coupled to the adjustable value capacitor, the calibration circuit being driven by a calibration clock signal and including a comparator and a state machine, wherein the state machine causes a capacitance value of the adjustable value capacitor to decrease from a higher capacitance value to a lower capacitance, wherein the calibration circuit adjusts a cutoff frequency of the filter when the filter is powered on by adjusting the capacitance value of the adjustable value capacitor until the cutoff frequency of the filter is within a predetermined range of a target cutoff frequency, and, wherein the state machine terminates a calibration operation after 16 cycles of the clock signal.

4. The apparatus as claimed in claim 3, wherein the adjustable value capacitor comprises a fixed capacitor and four binary weighted switched capacitors.

5. The apparatus as claimed in claim 3, wherein the calibration circuit is configured to adjust the capacitance value of the adjustable value capacitor until the comparator detects that a voltage across the adjustable value capacitor exceeds a reference voltage.

6. An apparatus, comprising:
   a filter comprising a first stage and a second stage, the first stage having a differential output and the second stage having a differential input;
   an adjustable value capacitor coupled in parallel between the differential output of the first stage of the filter and the differential input of the second stage of the filter; and a calibration circuit coupled to the adjustable value capacitor, the calibration circuit being driven by a calibration clock signal and including a comparator and a state machine, wherein the state machine causes a capacitance value of the adjustable value capacitor to decrease from a higher capacitance value to a lower capacitance, wherein the calibration circuit adjusts a cutoff frequency of the filter when the filter is powered on by adjusting the capacitance value of the adjustable value capacitor until the cutoff frequency of the filter is within a predetermined range of a target cutoff frequency, and, wherein the adjustable value capacitor comprises a fixed capacitor and four binary weighted switched capacitors.

7. An apparatus, comprising:
   a baseband processor;
   a digital-to-analog converter coupled to the baseband processor;
   a filter to filter an output of the digital-to-analog converter, the filter comprising a first stage and a second stage, the first stage having a differential output and the second stage having a differential input, and an adjustable value capacitor coupled in parallel between the differential output of the first stage of the filter and the differential input of the second stage of the filter;
   a programmable gain amplifier to amplify an output of the filter; and
   a calibration circuit to calibrate a cutoff frequency of the filter, the calibration circuit being driven by a calibration clock signal and including a comparator and a state machine, wherein the state machine is configured to cause a capacitance value of the adjustable value capacitor to decrease from a higher capacitance value to a lower capacitance based on an input value represented by a number of input binary bits, wherein the calibration circuit is configured to terminate a calibration operation after a number of clock cycles, wherein the number of clock cycles is at most equal to two to the power of the number of the input binary bits, and wherein the calibration circuit adjusts a cutoff frequency of the filter when the filter is powered on by adjusting the capacitance value of the adjustable value capacitor until the cutoff frequency of the filter is within a predetermined range of a target cutoff frequency.

8. The apparatus as claimed in claim 7, wherein the calibration circuit adjusts the capacitance value of the adjustable value capacitor until the comparator detects that a voltage across the adjustable value capacitor exceeds a reference voltage.

9. An apparatus, comprising:
   a baseband processor;
   a digital-to-analog converter coupled to the baseband processor;
   a filter to filter an output of the digital-to-analog converter, the filter comprising a first stage and a second stage, the first stage having a differential output and the second stage having a differential input, and an adjustable value capacitor coupled in parallel between the differential output of the first stage of the filter and the differential input of the second stage of the filter;
   a programmable gain amplifier to amplify an output of the filter; and
   a calibration circuit to calibrate a cutoff frequency of the filter, the calibration circuit being driven by a calibration clock signal and including a comparator and a state machine, wherein the state machine causes a capacitance value of the adjustable value capacitor to decrease from a higher capacitance value to a lower capacitance, wherein the calibration circuit adjusts a cutoff frequency of the filter when the filter is powered on by adjusting the capacitance value of the adjustable value capacitor until the cutoff frequency of the filter is within a predetermined range of a target cutoff frequency, and, wherein the state machine terminates a calibration operation after 16 cycles of the clock signal.

10. The apparatus as claimed in claim 9, wherein the adjustable value capacitor comprises a fixed capacitor and four binary weighted switched capacitors.

11. The apparatus as claimed in claim 9, wherein the calibration circuit is configured to adjust the capacitance value of the adjustable value capacitor until the comparator detects that a voltage across the adjustable value capacitor exceeds a reference voltage.

12. An apparatus, comprising:
a baseband processor;
a digital-to-analog converter coupled to the baseband processor;
a filter to filter an output of the digital-to-analog converter, the filter comprising a first stage and a second stage, the first stage having a differential output and the second stage having a differential input, and an adjustable value capacitor coupled in parallel between the differential output of the first stage of the filter and the differential input of the second stage of the filter;
a programmable gain amplifier to amplify an output of the filter; and a calibration circuit to calibrate a cutoff frequency of the filter, the calibration circuit being driven by a calibration clock signal and including a comparator and a state machine, wherein the state machine causes a capacitance value of the adjustable value capacitor to decrease from a higher capacitance value to a lower capacitance, wherein the calibration circuit adjusts a cutoff frequency of the filter when the filter is powered on by adjusting the capacitance value of the adjustable value capacitor until the cutoff frequency of the filter is within a predetermined range of a target cutoff frequency, and, wherein the adjustable value capacitor comprises a fixed capacitor and four binary weighted switched capacitors.

13. A method comprising:
adjusting a capacitance value of an adjustable value capacitor during a calibration operation using a binary input, the adjustable value capacitor being coupled in parallel between a differential output of a first stage of a filter and a differential input of a second stage of the filter;
adjusting a cutoff frequency of the filter when the filter is powered on by adjusting the capacitance value of the adjustable value capacitor until the cutoff frequency of the filter is within a range of a target cutoff frequency;
terminating the calibration operation after 16 cycles of a clock signal.

14. The method as claimed in claim 13, wherein adjusting the capacitance value of the adjustable value capacitor includes modifying a capacitance value of a combination of a fixed capacitor and four binary weighted switched capacitors.

15. The method as claimed in claim 13, wherein adjusting the capacitance value of the adjustable value capacitor is performed until a voltage across the adjustable value capacitor exceeds a reference voltage.

* * * * *